(12) United States Patent
Feng et al.

(10) Patent No.: US 8,934,201 B1
(45) Date of Patent: Jan. 13, 2015

(54) FLEXURE, HEAD GIMBAL ASSEMBLY AND DISK DRIVE UNIT WITH THE SAME

(71) Applicant: SAE Magnetics (H.K.) Ltd., Hong Kong (CN)

(72) Inventors: Xian Wen Feng, DongGuan (CN); Tan Tian, DongGuan (CN)

(73) Assignee: SAE Magnetics (H.K.) Ltd., Hong Kong (CN)

(*) Notice: Subject to any disclaimer, the term of this patent is extended or adjusted under 35 U.S.C. 154(b) by 0 days.

(21) Appl. No.: 14/143,002

(22) Filed: Dec. 30, 2013

(30) Foreign Application Priority Data

Dec. 9, 2013 (CN) .......................... 2013 1 0665445

(51) Int. Cl.
G11B 5/127 (2006.01)
(52) U.S. Cl.
USPC ........................................................ 360/264.2
(58) Field of Classification Search
USPC ........................................................ 360/264.2
See application file for complete search history.

(56) References Cited

U.S. PATENT DOCUMENTS

| | | | |
|---|---|---|---|
| 7,372,669 B2 * | 5/2008 | Deguchi et al. | 360/245.9 |
| 7,411,764 B2 * | 8/2008 | Yang et al. | 360/294.4 |
| 8,325,446 B1 * | 12/2012 | Liu et al. | 360/245.9 |
| 2008/0088975 A1 * | 4/2008 | Bennin et al. | 360/234.5 |

* cited by examiner

Primary Examiner — Mark Blouin
(74) Attorney, Agent, or Firm — Nixon & Vanderhye PC

(57) ABSTRACT

A flexure includes a substrate layer, a dielectric layer formed thereon, and a conducting layer formed on the dielectric layer, the conducting layer includes multiple conductive traces and multiple bonding pads arranged in a first direction and adapted for connecting with a PCB, each bonding pad includes a first portion and a second portion, a first window is opened on the substrate layer, and a second window is opened on the dielectric layer to expose the bonding pads, wherein the substrate layer includes multiple first protuberances extending from at least one side wall of the first window along a second direction which is perpendicular to the first direction to cover the first portion of each bonding pad, and the second portion of each bonding pad includes at least one notch or hole. The flexure is applicable to connected with a PCB by soldering jetting process or hot bar process.

10 Claims, 15 Drawing Sheets

US 8,934,201 B1

FLEXURE, HEAD GIMBAL ASSEMBLY AND DISK DRIVE UNIT WITH THE SAME

This application claims priority to Chinese Application No. 201310665445.7 filed Dec. 9, 2013, the entire contents of which is hereby incorporated by reference.

FIELD OF THE INVENTION

The present invention relates in general to information recording disk drive, and more particularly to a flexure, a head gimbal assembly (HGA) and a disk drive unit with the same.

BACKGROUND OF THE INVENTION

Disk drive unit is a common information storage device. Referring to FIG. 1a, a conventional disk drive unit 1' contains a number of rotatable magnetic disks 12' attached to a spindle motor 13', and a head stack assembly (HSA) 14' which is rotatable about an actuator arm axis 16' for accessing data tracks on the magnetic disks 12' during seeking. The HSA 14' contains a set of drive arms 142' and HGAs 144' mounted on the ends of the drive arms 142'. Typically, a spindling voice-coil motor (VCM) 18' is provided for controlling the motion of the drive arm 142'.

Referring to FIGS. 1a and 1b, the HGA 144' contains a magnetic head 1442' and a suspension 1443' supporting the magnetic head 1442'. When the hard disk drive 1' is on, the spindle motor 13' will rotate the magnetic disk 12' at a high speed, and the magnetic head 1442' will fly above the magnetic disk 12' due to the air pressure drawn by the rotated magnetic disk 12'. The magnetic head 1442' moves across the surface of the magnetic disk 12' in the radius direction under the control of the VCM 18'. With a different track, the magnetic head 1442' can read data from or write data to the magnetic disk 12'. The suspension 1443' includes a load beam 1444', a base plate 1445', a hinge 1446' and a flexure 200', all of which are assembled with each other. The hinge 1446' has a mounting hole 1446a' formed thereon to assemble the hinge 1446' to the base plate 1445'. The flexure 200' includes a suspension tongue (not shown), and the magnetic head 1442' is carried on the suspension tongue.

Generally, multiple electrical connection pads are arranged on one end of the flexure 200' and adapted for connecting to the magnetic head 1442' by a way of solder joints. The other end of the flexure 200', also known as flexure tail 220' (as shown in FIG. 2a), has a number of bonding pads 2264' disposed thereon and connected to a printed circuit board (PCB) 19' (as shown in FIG. 1a). Thus, the flexure 200' serves as the bridge electrically connecting the magnetic head 1442' and the PCB 19'.

Conventionally, the methods of connecting the flexure tail with the PCB 19' include soldering jetting process and hot bar process, but the configurations of the flexure tails are different for the two different processes. FIGS. 2a to 2c shows a conventional flexure tail 220' connected with the PCB 19' by the way of soldering jetting process, and FIGS. 3a to 3c shows another conventional flexure tail 240' connected with the PCB 19' by the way of hot bar process.

Referring to FIGS. 2a to 2c, this conventional flexure tail 220' (namely soldering jetting flexure tail) contains a stainless steel type (SST) layer 222', a dielectric layer 224', a copper layer 226' and a cover layer 228'. The detailed configuration of the flexure tail 220' is that the dielectric layer 224' is sandwiched between the SST layer 222' and the copper layer 226', and the cover layer 228' covers the copper layer 226'. The copper layer 226' comprises a plurality of conductive traces 2262' and a plurality of bonding pads 2264' adapted for connecting with the PCB 19', the SST layer 222', the dielectric layer 224', and the cover layer 228' are configured with at least a window therein to expose the bonding pads 2264', wherein a hole 2266' is disposed at a center position of each bonding pad 2264'. During the soldering jetting process, a front side (as shown in FIG. 2a) of the flexure tail 220' abuts against the PCB 19' with the bonding pads 2264' of the flexure tail 220' being aligned with a plurality of electrical pads (not shown) of the PCB 19'. Preferably, without regard to the hole 2266', the shape and size of the bonding pad 2264' are the same with that of the electrical pad of the PCB 19'. Then, a molten soldering is jetted on a back side (as shown in FIG. 2b) of each bonding pad 2264', and the molten soldering flows to the front side of the bonding pad 2264' through the hole 2266'. When the molten soldering become solid, the bonding pad 2264' can be connected with the electrical pad of the PCB 19'.

Referring to FIGS. 3a to 3c, another conventional flexure tail 240' (namely hot bar flexure tail) has the same structure with the conventional flexure tail 220' mentioned-above except the following differences, (1) no hole is disposed at any bonding pad 2464', (2) a SST bar 2422' is disposed on the back side of each bonding pad 2464' (as shown in FIG. 3b). During the hot bar process, a front side (as shown in FIG. 3a) of the flexure tail 240' abuts against the PCB 19' with the bonding pads 2464' of the flexure tail 240' being aligned with a plurality of electrical pads of the PCB 19', and each electrical pad is applied with a tin layer. Then, a hot bar (not shown) is connected with the SST bar 2422' lain on the back side of the bonding pad 2464', the hot bar is a heat source, and the SST bar 2422' serves as a thermal conductor, so the bonding pad 2464' can be heated by the hot bar, and the heat is transferred to the electrical pad of the PCB 19' that connected to the front side of the bonding pad 2464'. Thus, the tin layer on the electrical pad will be melted. When the hot bar is moved from the SST bar 2422' or stops supplying heat, the melted tin layer can be solid again, and then the bonding pad 2464' and electrical pad can be connected together.

In conclusion, some manufactures use soldering jetting process, while others use hot bar process, and different types of processes need different types of flexure tails 220', 240', so different types of flexure tails 220', 240' must be provided to meet the needs of all manufactures, which would need different machine tools, more space, and more workers to produce. In addition, it is difficult to estimate the exact demand of different types of flexure tails 220', 240', which may result in inventory buildups. All of these mentioned-above will increase the manufacturing cost.

Hence, it is desired to provide a flexure, an HGA, and a disk drive unit to overcome the above-mentioned drawbacks.

SUMMARY OF THE INVENTION

One objective of the present invention is to provide a flexure, which is applicable to connect with a PCB by soldering jetting process or hot bar process, thereby reducing manufacturing cost.

Another objective of the present invention is to provide a head gimbal assembly (HGA) with a flexure, which is applicable to connect to a PCB by soldering jetting process or hot bar process, thereby reducing manufacturing cost.

Still one objective of the present invention is to provide a disk drive unit with a flexure, which is applicable to connect to a PCB by soldering jetting process or hot bar process, thereby reducing manufacturing cost.

The above objectives are achieved by providing a flexure for a suspension of a head gimbal assembly, including a substrate layer, a dielectric layer formed thereon, and a conducting layer formed on the dielectric layer, the conducting layer including a plurality of conductive traces and a plurality of bonding pads arranged in a first direction and adapted for connecting with a printed circuit board, each bonding pad including a first portion and a second portion, a first window being opened on the substrate layer, and a second window corresponding to the first window being opened on the dielectric layer to expose the bonding pads, wherein the substrate layer includes a plurality of first protuberances extending from at least one side wall of the first window along a second direction which is perpendicular to the first direction to cover the first portion of each bonding pad, and the second portion of each bonding pad includes at least one notch or hole.

Preferably, the first portion of the bonding pad includes a top section and a bottom section connected with the second portion respectively.

Preferably, the first protuberances are extended from two opposite walls of the first window to cover the first portion.

Preferably, the dielectric layer comprises a plurality of second protuberances extending from at least one side wall of the second window, which are shaped and sized larger than the first protuberances to support the first protuberances.

Preferably, the second protuberances are extended from two opposite walls of the second window of the dielectric layer.

Preferably, the flexure further includes a cover layer covered on the conducting layer, and a third window corresponding to the first window being opened on the cover layer to expose the bonding pads.

As an embodiment of the present invention, two notches are formed symmetrically at two edges of the second portion.

As another embodiment of the present invention, the hole is formed on a center position of the second portion.

A head gimbal assembly, comprising a suspension having a flexure and a slider supported on the suspension, the flexure comprising a substrate layer, a dielectric layer formed thereon, and a conducting layer formed on the dielectric layer, the conducting layer comprising a plurality of conductive traces and a plurality of bonding pads arranged in a first direction and adapted for connecting with a printed circuit board, each bonding pad comprising a first portion and a second portion, a first window being opened on the substrate layer, and a second window corresponding to the first window being opened on the dielectric layer to expose the bonding pads, wherein the substrate layer comprises a plurality of first protuberances extending from at least one side wall of the first window along a second direction which is perpendicular to the first direction to cover the first portion of each bonding pad, and the second portion of each bonding pad comprises at least one notch or hole.

A disk drive unit, comprising a head gimbal assembly, a drive arm attached to the head gimbal assembly, a disk, and a spindle motor to spin the disk, a suspension having a flexure and a slider supported on the suspension, the flexure comprising a substrate layer, a dielectric layer formed thereon, and a conducting layer formed on the dielectric layer, the conducting layer comprising a plurality of conductive traces and a plurality of bonding pads arranged in a first direction and adapted for connecting with a printed circuit board, each bonding pad comprising a first portion and a second portion, a first window being opened on the substrate layer, and a second window corresponding to the first window being opened on the dielectric layer to expose the bonding pads, wherein the substrate layer comprises a plurality of first protuberances extending from at least one side wall of the first window along a second direction which is perpendicular to the first direction to cover the first portion of each bonding pad, and the second portion of each bonding pad comprises at least one notch or hole.

In comparison with the prior art, the first portion of each bonding pad is covered by first protuberance(s), and the second portion of each bonding pad includes at least one notch or hole. When this flexure is connected with a PCB by soldering jetting process, the flexure is put against the PCB with the bonding pads of the flexure being aligned with the electrical pads of the PCB. Then a molten soldering is jetted on a side of each bonding pad which side is exposed by the first and second windows, and then the molten soldering flows to the opposite side of each bonding pad which side is close to the PCB through the notch or the hole. When the molten soldering become solid, the bonding pad can be connected with the electrical pad of the PCB, namely, the flexure can be connected with the PCB by soldering jetting process. When the flexure is connected with the PCB by hot bar process, the same is that the flexure is put against the PCB with the bonding pads of the flexure being aligned with the electrical pads of the PCB, each electrical pad is applied with a tin layer. Then, a hot bar is connected with the first protuberance by which the first portion of each bonding pad is covered, the hot bar is a thermal source, and the first protuberance serves as a thermal conductor, so the bonding pad can be heated by the hot bar, and the heat is transferred to the electrical pad of the PCB that is close to the bonding pad, thus, the tin layer on the electrical pad will be melted. When the hot bar is moved from the first protuberance or stops supplying heat, the melted tin layer can be solid again, and then the bonding pad and the electrical pad can be connected together, namely, the flexure can be connected with the PCB by hot bar process. In sum, the flexure of the present invention can be connected with a PCB by soldering jetting process and hot bar process as well, which can meet the needs of all manufactures, though some manufactures use hot bar process and the others use soldering jetting process.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings:

FIG. 2c is an exploded view of the conventional flexure tail as shown in FIG. 2a;

FIG. 3c is an exploded view of the conventional flexure tail as shown in FIG. 3a;

FIG. 5c is an exploded view of the flexure tail as shown in FIG. 5a;

FIG. 6c is an exploded view of the flexure tail as shown in FIG. 6a;

FIG. 9c is an exploded view of the flexure tail as shown in FIG. 9a.

DETAILED DESCRIPTION OF ILLUSTRATED EMBODIMENTS

Figure 1A:
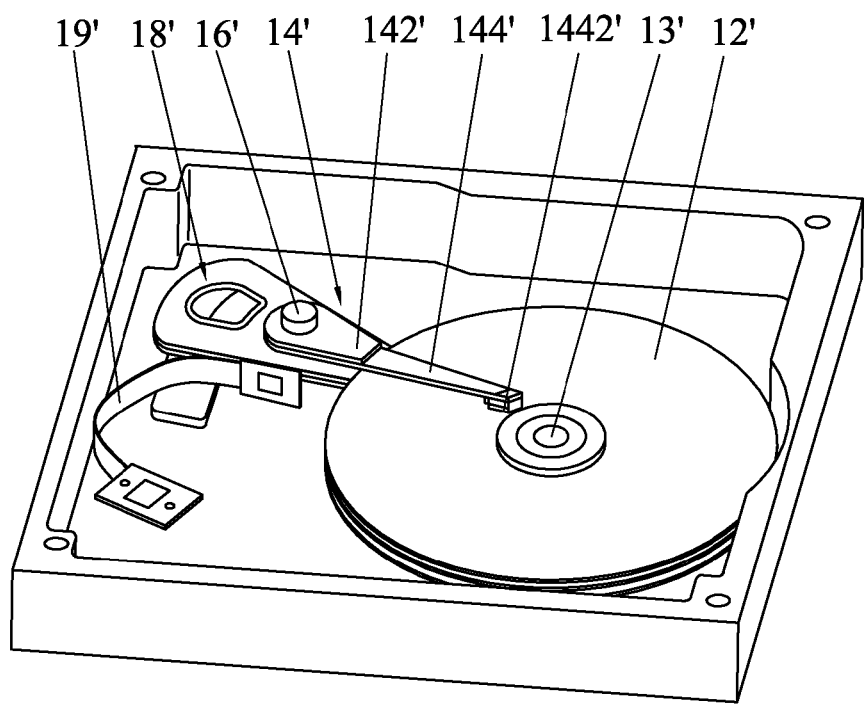
FIG. 1a is a perspective view of a conventional disk drive unit.
Figure 1B:
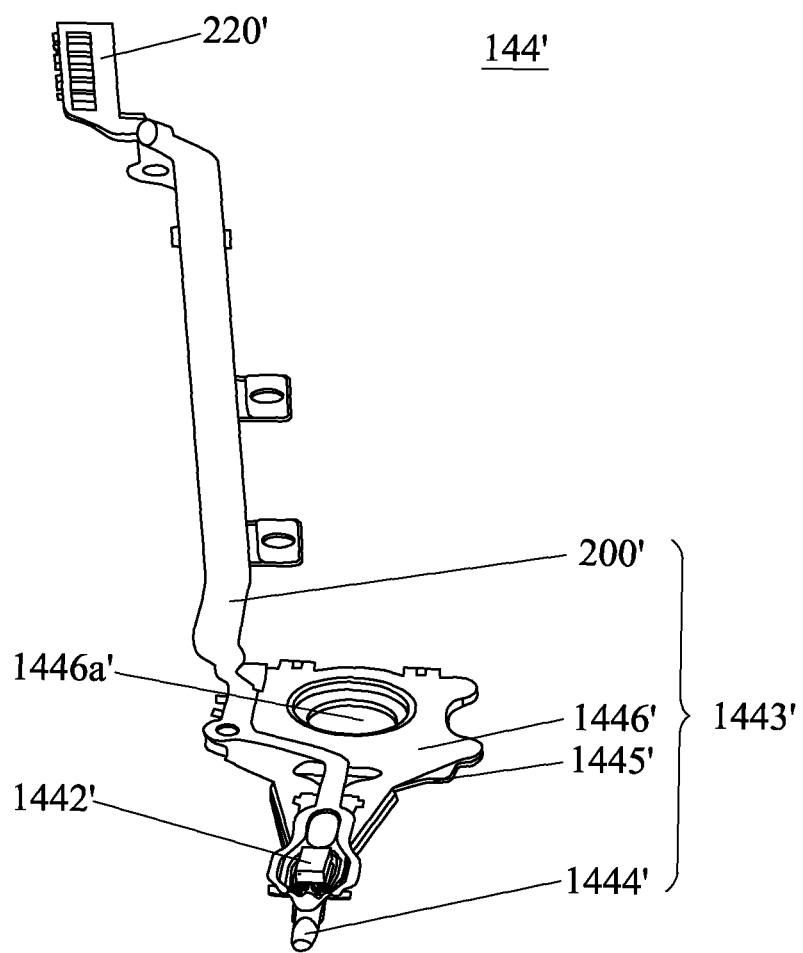
FIG. 1b is a partial perspective view of a conventional HGA with a magnetic head.
Figure 2A:
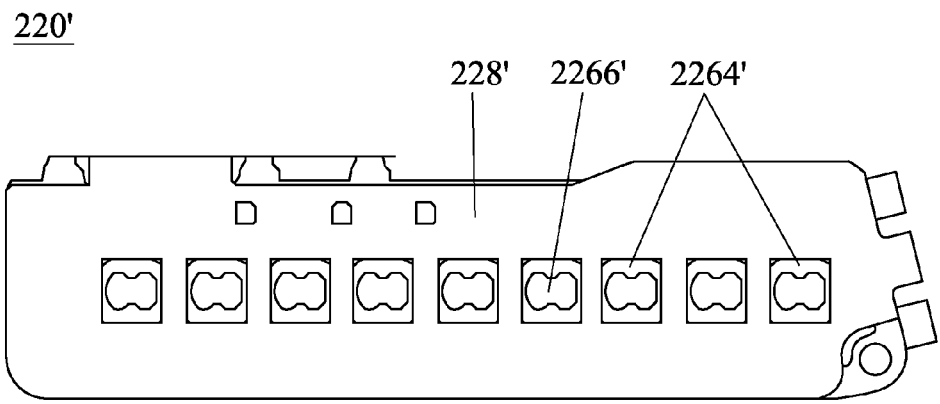
FIG. 2a is a schematic view of a conventional flexure tail seen from the cover layer.
Figure 2B:
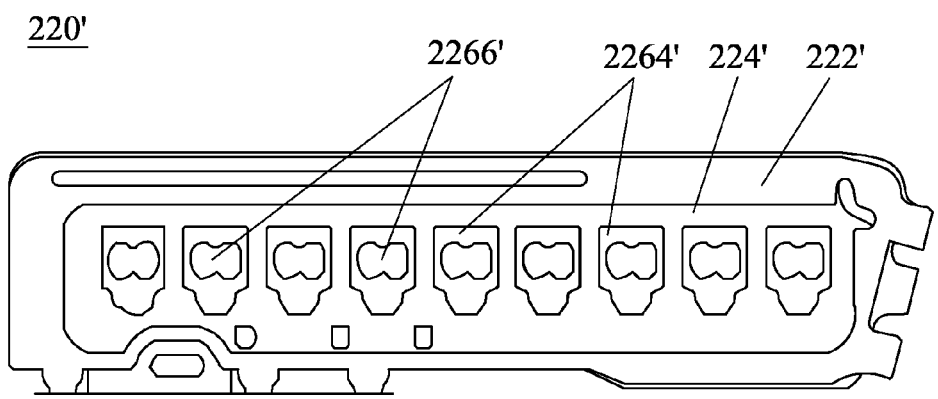
FIG. 2b is a schematic view of the conventional flexure tail as shown in FIG. 2a seen from the SST layer.
Figure 2C:
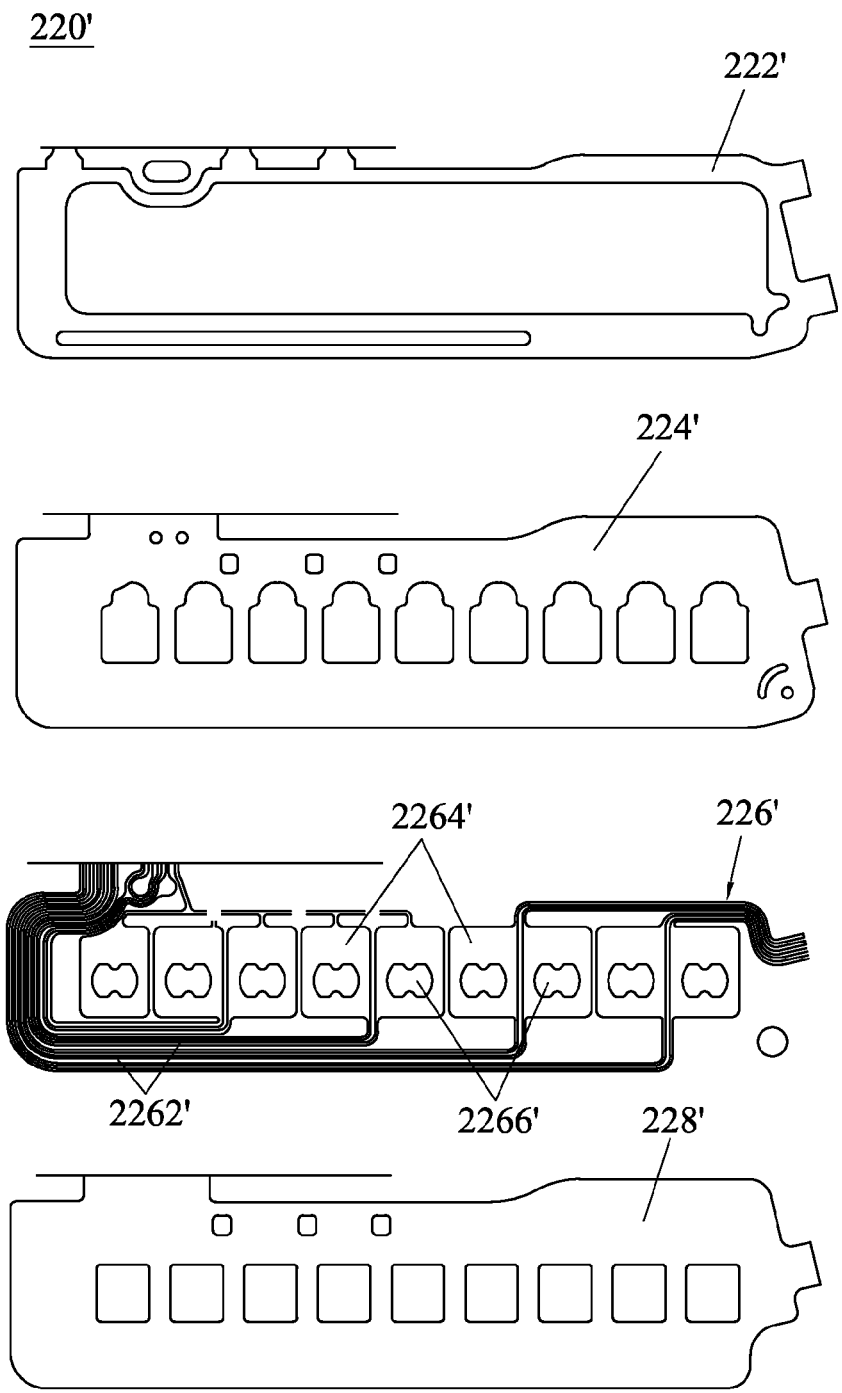
Figure 3A:
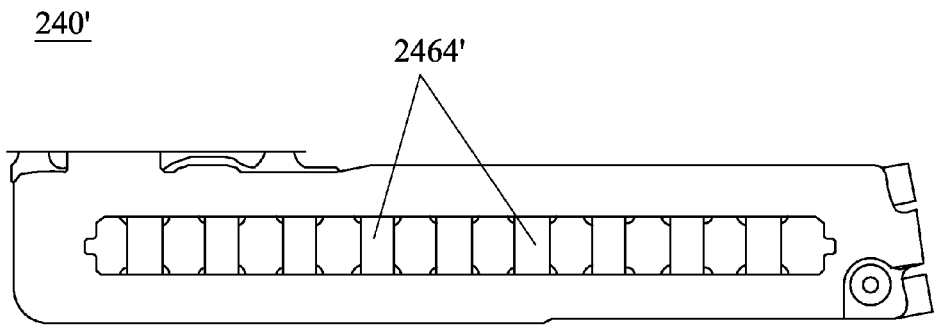
FIG. 3a is a schematic view of another conventional flexure tail seen from the cover layer.
Figure 3B:
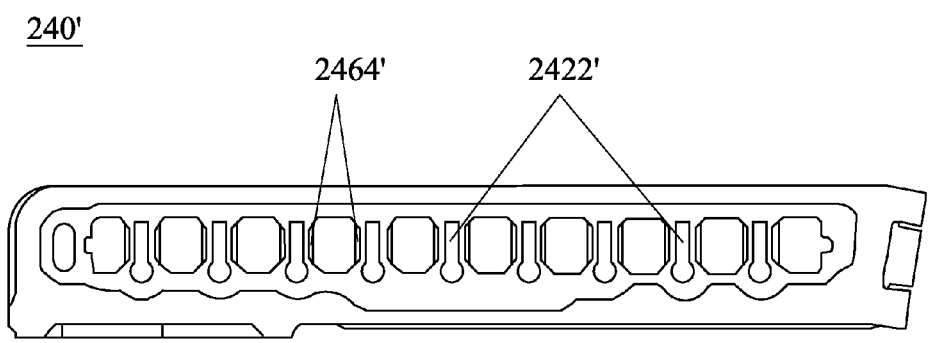
FIG. 3b is a schematic view of the conventional flexure tail as shown in FIG. 3a seen from the SST layer.
Figure 3C:
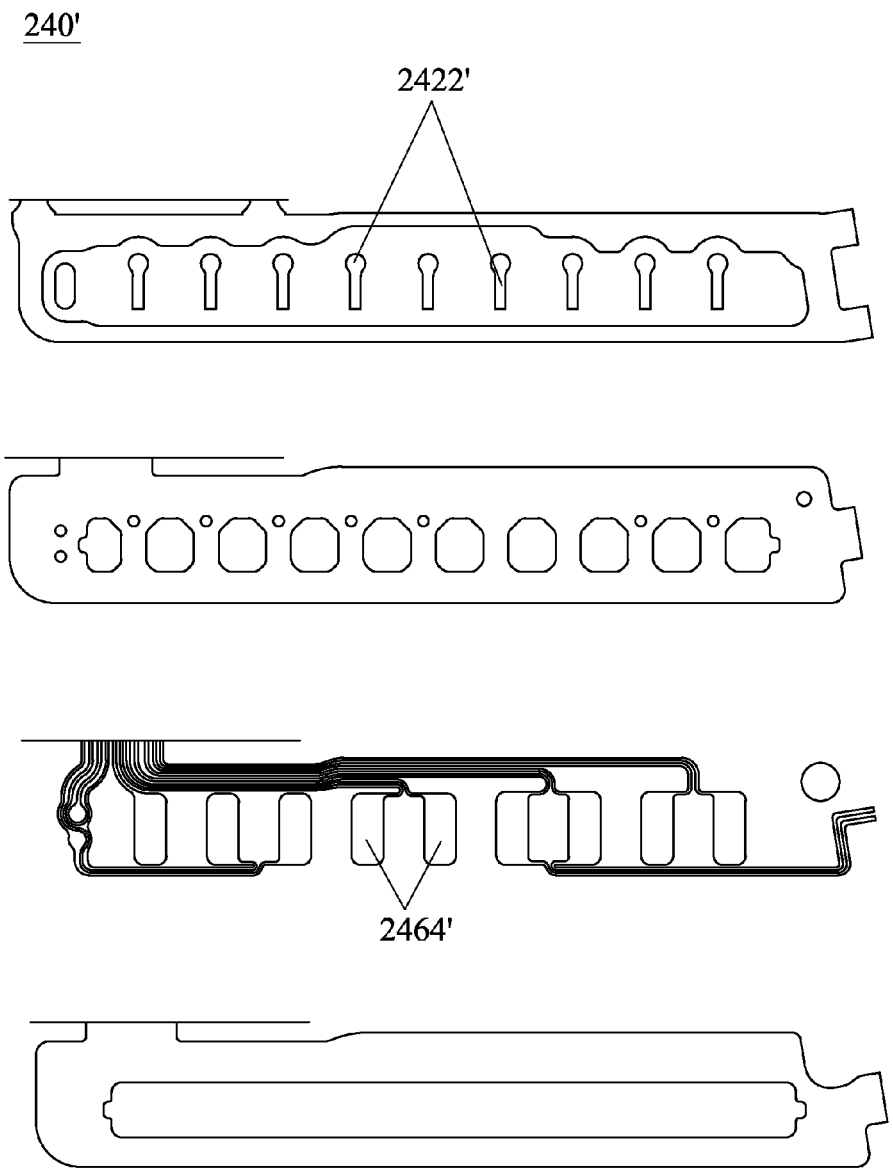

Various preferred embodiments of the invention will now be described with reference to the figures, wherein like reference numerals designate similar parts throughout the various views. As indicated above, the present invention is directed to a flexure, an HGA, and a disk drive unit with the same, the flexure is applicable to connected with a PCB by soldering jetting process or hot bar process.

Figure 4A:
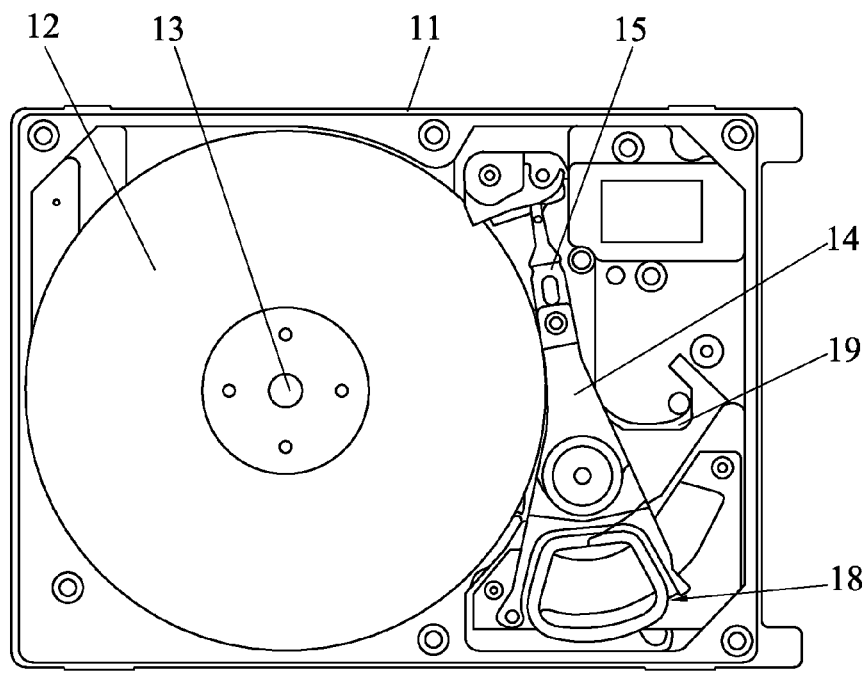
FIG. 4a is a perspective view of the disk drive unit according to one embodiment of the present invention.

FIG. 4a is a perspective view of the disk drive unit of the present invention. As shown, a disk drive unit 1 contains a number of rotatable magnetic disks 12 attached to a spindle motor 13, a set of drive arms 14 and HGAs 15 mounted on the ends of the drive arms 14, all of which are mounted in a housing 11. Typically, a VCM 18 is provided for controlling the motion of the drive arm 14.

Figure 4B:
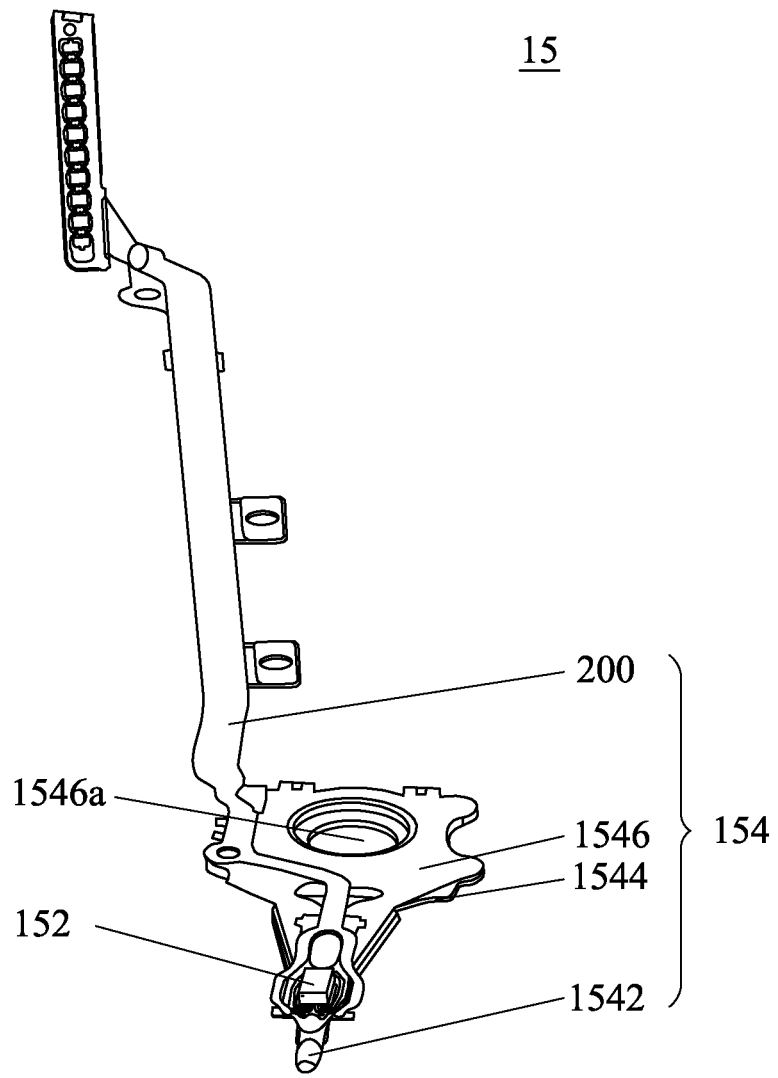
FIG. 4b is a perspective view of the HGA according to one embodiment of the present invention.

Referring to FIGS. 4a and 4b, The HGA 15 contains a magnetic head 152 and a suspension 154 for supporting the magnetic head 152. The suspension 154 includes a load beam 1542, a base plate 1544, a hinge 1546 and a flexure 200, all of which are assembled with each other. The hinge 1546 has a mounting hole 1546a formed thereon to assemble the hinge 1546 to the base plate 1544. The flexure 200 includes a suspension tongue (not shown), and the magnetic head 152 is carried on the suspension tongue.

Figure 5A:
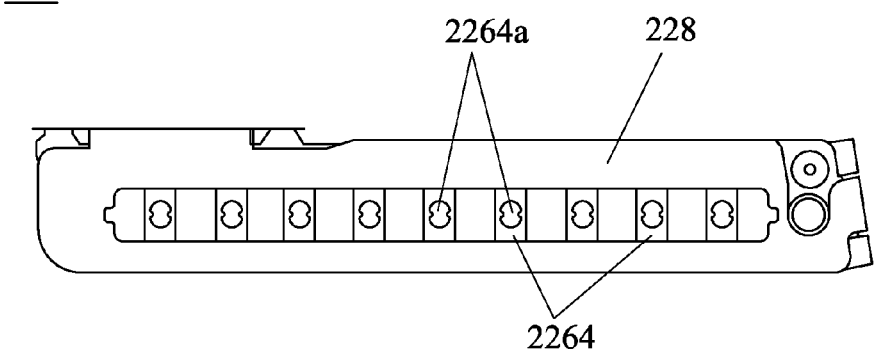
FIG. 5a is a schematic view of a flexure tail seen from the cover layer according to the first embodiment of the present invention.

Generally, multiple electrical connection pads are arranged on one end of the flexure 200 and adapted for connecting to the magnetic head 152 by a way of solder joints. The other end of the flexure 200, also known as flexure tail 220 (as shown in FIG. 5a), has a number of bonding pads 2264 disposed thereon and connected to a printed circuit board (PCB) 19 (as shown in FIG. 4a). Thus, the flexure 200 serves as the bridge electrically connecting the magnetic head 152 and the PCB 19.

Figure 5B:
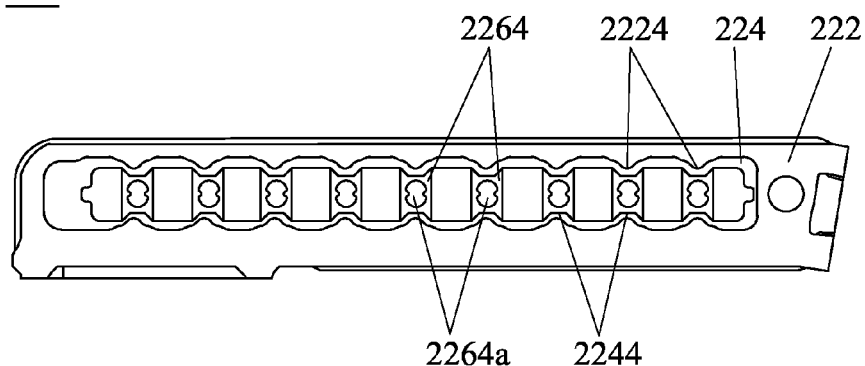
FIG. 5b is a schematic view of the flexure tail as shown in FIG. 5a seen from the substrate layer.
Figure 5C:
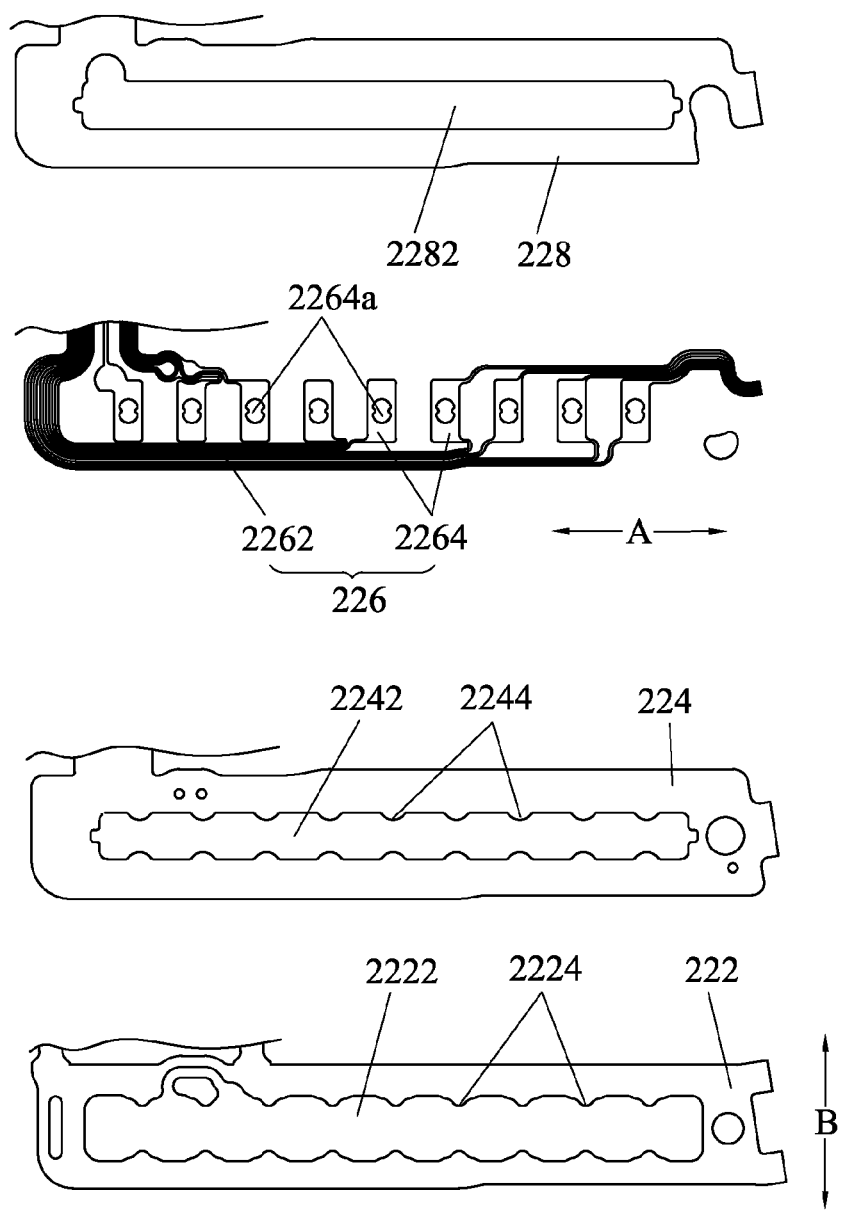

Concretely, the flexure 200 with a flexure tail has a layer structure. FIGS. 5a to 5c show a flexure tail 220 according to the first embodiment of the present invention, the flexure tail 220 includes a substrate layer 222, a dielectric layer 224 formed thereon, a conducting layer 226 formed on the dielectric layer 224, and a cover layer 228 formed on the conducting layer 226. Concretely, the substrate layer 222 is made of stainless steel, the dielectric layer 224 and the cover layer 228 are made of polyimide, and the conducting layer 226 is made of copper.

The conducting layer 226 including a plurality of conductive traces 2262 and a plurality of bonding pads 2264 arranged at intervals and extended along a first direction A, the bonding pad 2264 can be all shapes, preferably, is rectangle. The bonding pads 2264 of the conducting layer 226 are adapted for connecting with a plurality of electrical pads (not shown) of the PCB 19, in general, the electrical pads of the PCB 19 have the same shape and size with the bonding pads 2264, but the conducting layer 226 is sandwiched between the cover layer 228 and the dielectric layer 224, thus the substrate layer 222, the dielectric layer 224, and the cover layer 228 must be configured to expose the bonding pads 2264. Correspondingly, a first window 2222 is opened on the substrate layer 222, a second window 2242 corresponding to the first window 2222 is opened on the dielectric layer 224, and a third window 2282 corresponding to the first window 2222 as well is opened on the cover layer 228 to expose the bonding pads 2264.

Each bonding pad 2264 includes a first portion and a second portion, the first portion includes a top section or/and a bottom section of the bonding pad 2264, preferably, the first portion includes the top section and the bottom section, and the second portion is the rest portion except the first portion and sandwiched between the top section and the bottom section. In one implementation, the substrate layer 222 includes a plurality of first protuberances 2224 extend from one side wall of the first window 2222 along a second direction B which is perpendicular to the first direction A to cover the first portion of each bonding pad 2264, wherein, the first portion is the top section or the bottom section. In order to electrically isolate the first protuberances 2224 from the bonding pads 2264, preferably, the dielectric layer 224 comprises a plurality of second protuberances 2244 extending from one side wall of the second window 2242 to support the first protuberances 2224, which are sandwiched between the bonding pads 2264 and the first protuberances 2224 and shaped larger than the first protuberances 2224. In another implementation, the first protuberances 2224 extend from two opposite wall of the first window 2222 to cover the first portion, wherein, the first portion includes the top section and the bottom section of each bonding pad 2264, and the second protuberances 2244 are extended from two opposite walls of the second window 2242 of the dielectric layer 224 to support the first protuberances 2224. At least one hole 2264a is opened at the second portion of each bonding pad 2264, and preferably, the hole 2264a is formed on a center position of the bonding pad 2264. The number, size, and shape of the hole 2264a are not limited. As shown in FIG. 5a, the hole 2264a is in a shape of a gourd.

Figure 6A:
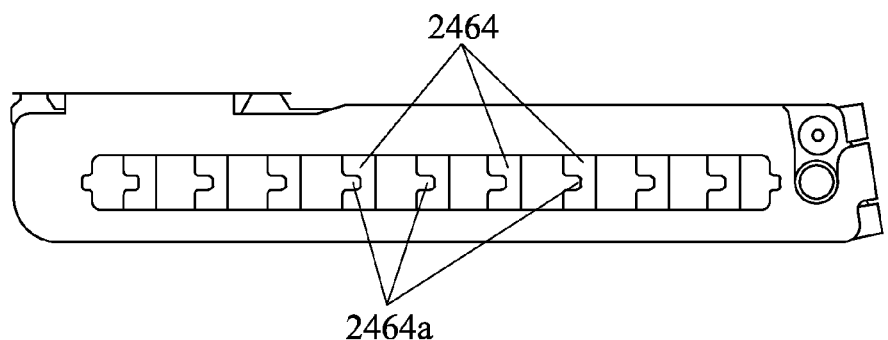
FIG. 6a is a schematic view of a flexure tail seen from the cover layer according to the second embodiment of the present invention.
Figure 6B:
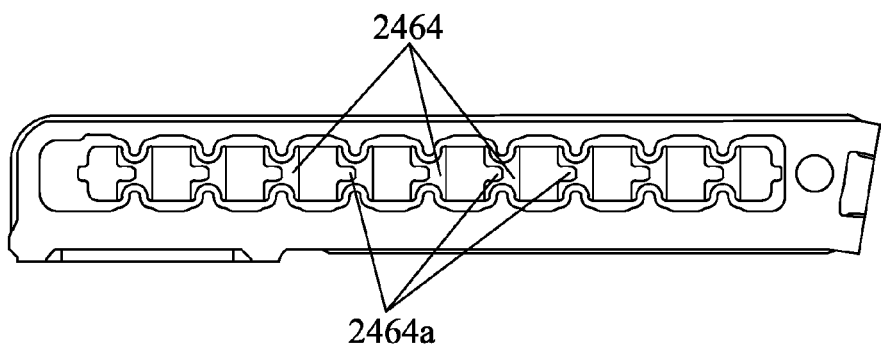
FIG. 6b is a schematic view of the flexure tail as shown in FIG. 6a seen from the substrate layer.
Figure 6C:
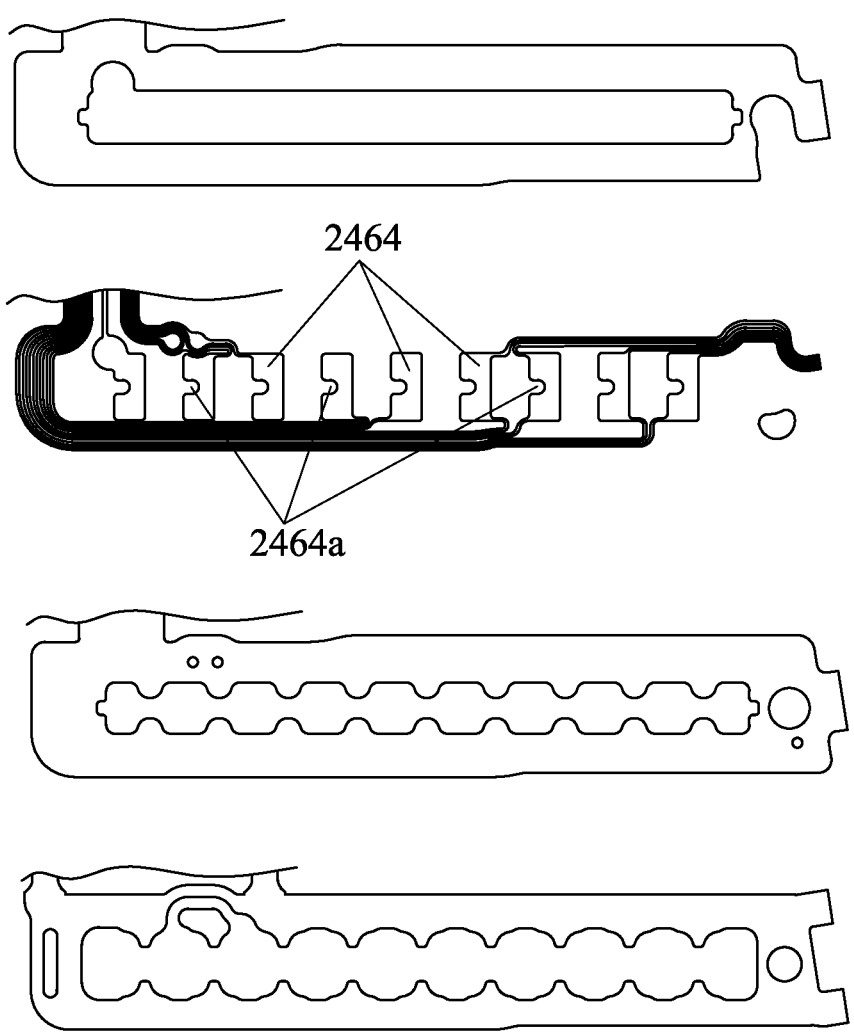
Figure 7A:
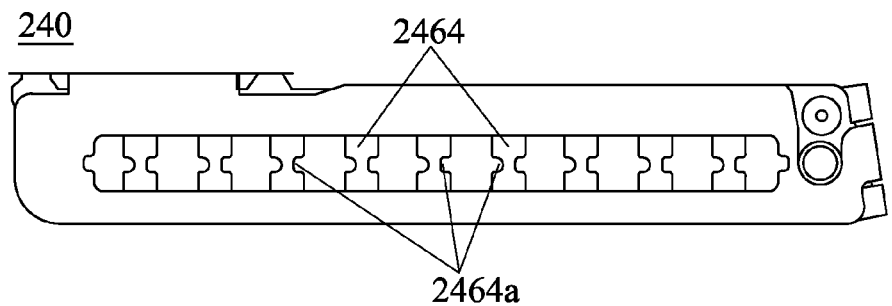
FIG. 7a is another schematic view of a flexure tail seen from the cover layer according to the second embodiment of the present invention.
Figure 7B:
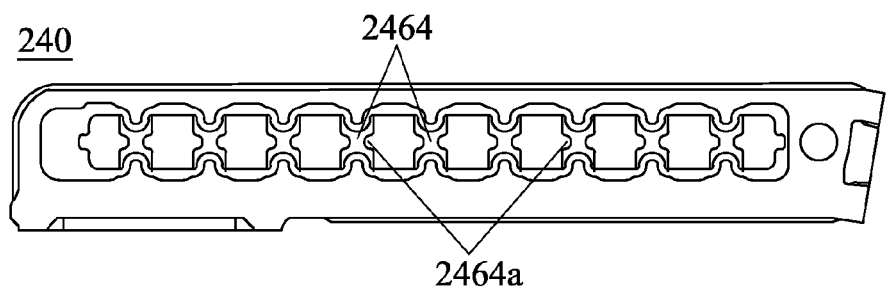
FIG. 7b is a schematic view of the flexure tail as shown in FIG. 7a seen from the substrate layer.
Figure 8A:
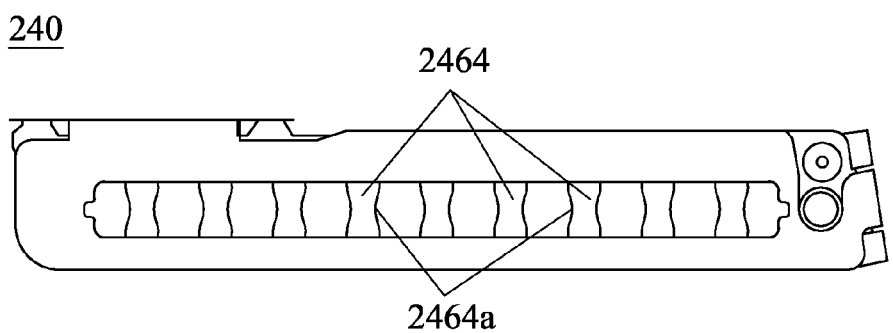
FIG. 8a is a third schematic view of a flexure tail seen from the cover layer according to the second embodiment of the present invention.
Figure 8B:
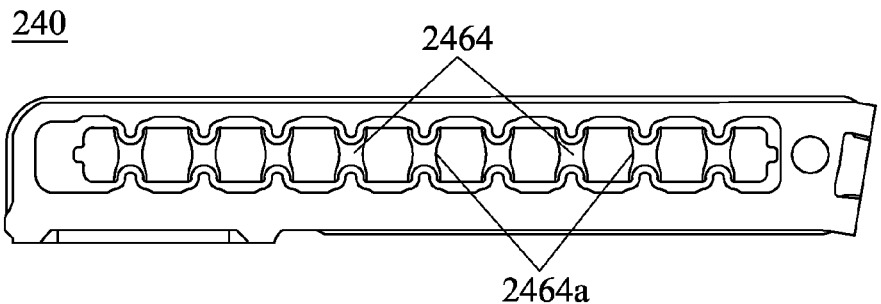
FIG. 8b is a schematic view of the flexure tail as shown in FIG. 8a seen from the substrate layer.

FIGS. 6a to 6c show another flexure tail 240 according to the second embodiment of the present invention, the structure of this flexure tail 240 is similar with that of the flexure tail 220 mentioned-above, and the only difference is that the second portion of each bonding pad 2464 contains at least one notch 2464a formed thereon without hole. The notch 2464a is opened at the edge of the bonding pad 2464, and the number, shape and size of the notch 2464a are not limited. As shown in FIGS. 6a to 6c, the bonding pad 2464 with one notch 2464a is in a shape of a mouth, preferably, the notch 2464a is formed on a center position of the edge of the bonding pad 2464. As shown in FIGS. 7a to 7b, the bonding pad 2464 with two notches 2464a is in a shape of a dumbbell, and two notches 2464a are formed symmetrically at two edges of the bonding pad 2464. As shown in FIGS. 8a to 8b, the bonding pad 2464 with two notches 2464a is in a shape of a waist.

Figure 9A:
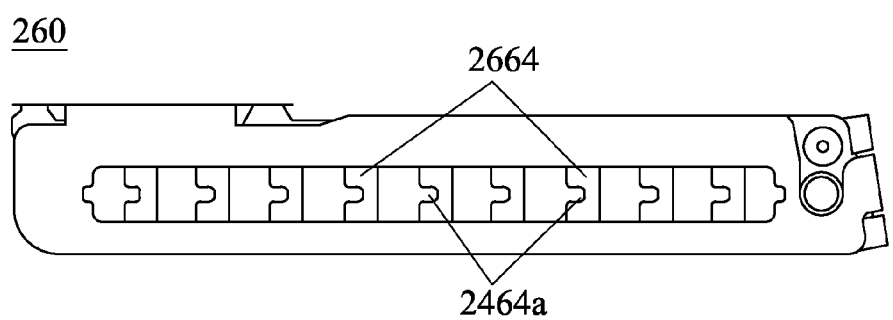
FIG. 9a is a schematic view of a flexure tail seen from the cover layer according to the third embodiment of the present invention.
Figure 9B:
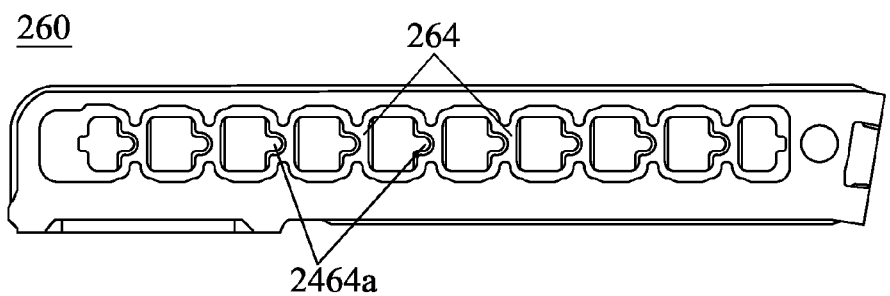
FIG. 9b is a schematic view of the flexure tail as shown in FIG. 9a seen from the substrate layer.
Figure 9C:
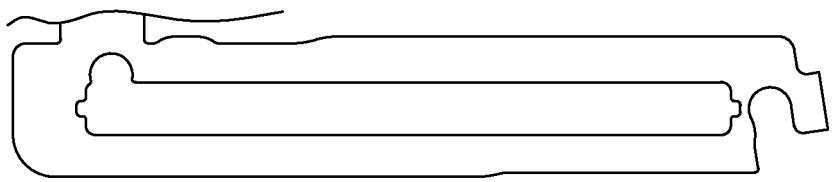
Figure 9C:
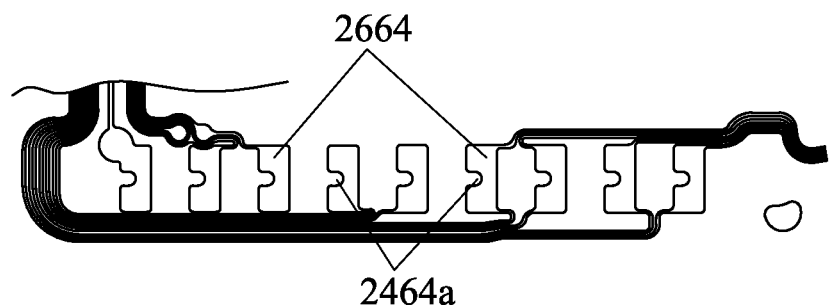
Figure 9C:
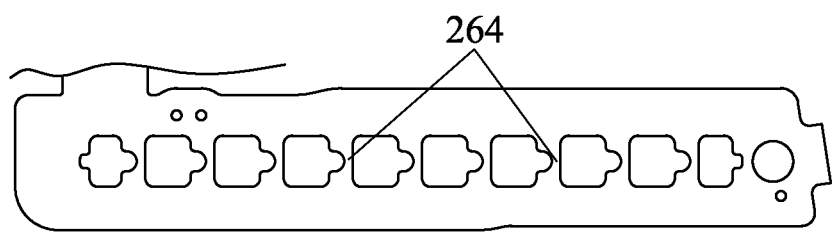
Figure 9C:
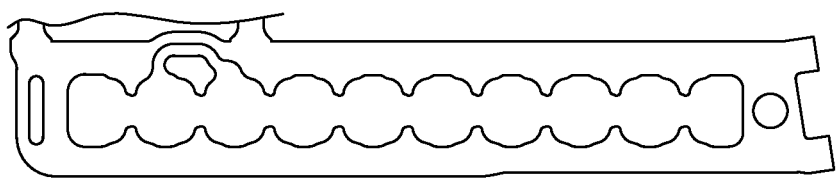

FIGS. 9a to 9c show another flexure tail 260 according to the third embodiment of the present invention, the structure of this flexure tail 260 is similar with that of the flexure tail 220, 240, that is, the bonding pad 2664 of the flexure tail 260 can be same with the bonding pad 2264 or the bonding pad 2464, including at least one notch 2464a or hole 2264a opened thereon. FIG. 9b just shows a flexure tail 260 with each bonding pad 2664 being opened a notch 2464a. The only difference exists in the structure of a dielectric layer 264, the dielectric layer 264 covers the back side of each bonding pad 2664 with the notch 2464a exposed, preferably, the edges of the notch 2464a is exposed as well. Due to the dielectric layer 264, the bonding pads 2664 can be supported more firmly.

In conclusion, the first portion of each bonding pad is covered by first protuberance(s), and the second portion of each bonding pad includes at least one notch or hole. When this flexure is connected with a PCB by the way of soldering jetting process, the flexure tail is put against the PCB with a front side of the bonding pads (as shown in FIGS. 5a, 6a, 7a, 8a, and 9a) being aligned with the electrical pads of the PCB. Then a molten soldering is jetted on a back side of each bonding pad which side is exposed by the first and second windows (as shown in FIGS. 5b, 6b, 7b, 8b, and 9b), and then the molten soldering flows to the front side of each bonding pad through the notch or the hole. When the molten soldering become solid, the bonding pad can be connected with the electrical pad of the PCB, namely, the flexure can be connected with the PCB by the way of soldering jetting process. When the flexure is connected with the PCB by the way of hot bar process, the same is that the flexure tail is put against the PCB with the front side of the bonding pads being aligned with the electrical pads of the PCB, each electrical pad is applied with a tin layer. Then, a hot bar is connected with the first protuberance by which the first portion of each bonding pad is covered, the hot bar is a thermal source, and the first protuberance serves as a thermal conductor, so the bonding pad can be heated by the hot bar, and the heat is transferred to the electrical pad of the PCB that is close to the bonding pad, thus, the tin layer on the electrical pad will be melted. When the hot bar is moved form the first protuberance or stops supplying heat, the melted tin layer can be solid again, and then the bonding pad and the electrical pad can be connected together, namely, the flexure can be connected with the PCB by hot bar process. In sum, the flexure of the present invention can be connected with a PCB by soldering jetting process and hot bar process as well, which can meet the needs of all manufactures, though some manufactures use hot bar process and the others use soldering jetting process.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A flexure for a suspension of a head gimbal assembly, comprising a substrate layer, a dielectric layer formed thereon, and a conducting layer formed on the dielectric layer, the conducting layer comprising a plurality of conductive traces and a plurality of bonding pads arranged in a first direction and adapted for connecting with a printed circuit board, each bonding pad comprising a first portion and a second portion, a first window being opened on the substrate layer, and a second window corresponding to the first window being opened on the dielectric layer to expose the bonding pads, wherein the substrate layer comprises a plurality of first protuberances extending from at least one side wall of the first window along a second direction which is perpendicular to the first direction to cover the first portion of each bonding pad, and the second portion of each bonding pad comprises at least one notch or hole.

2. The flexure according to claim 1, wherein the first portion of the bonding pad comprises a top section and a bottom section connected with the second portion respectively.

3. The flexure according to claim 1, wherein the first protuberances are extended from two opposite walls of the first window to cover the first portion.

4. The flexure according to claim 1, wherein the dielectric layer comprises a plurality of second protuberances extending from at least one side wall of the second window, which are shaped and sized larger than the first protuberances to support the first protuberances.

5. The flexure according to claim 4, wherein the second protuberances are extended from two opposite walls of the second window of the dielectric layer.

6. The flexure according to claim 1, further comprising a cover layer covered on the conducting layer, and a third window corresponding to the first window being opened on the cover layer to expose the bonding pads.

7. The flexure according to claim 1, wherein two notches are formed symmetrically at two edges of the second portion.

8. The flexure according to claim 1, wherein the hole is formed on a center position of the second portion.

9. A head gimbal assembly, comprising a suspension having a flexure and a slider supported on the suspension, the flexure comprising a substrate layer, a dielectric layer formed thereon, and a conducting layer formed on the dielectric layer, the conducting layer comprising a plurality of conductive traces and a plurality of bonding pads arranged in a first direction and adapted for connecting with a printed circuit board, each bonding pad comprising a first portion and a second portion, a first window being opened on the substrate layer, and a second window corresponding to the first window being opened on the dielectric layer to expose the bonding pads, wherein the substrate layer comprises a plurality of first protuberances extending from at least one side wall of the first window along a second direction which is perpendicular to the first direction to cover the first portion of each bonding pad, and the second portion of each bonding pad comprises at least one notch or hole.

10. A disk drive unit, comprising a head gimbal assembly, a drive arm attached to the head gimbal assembly, a disk, and a spindle motor to spin the disk, a suspension having a flexure and a slider supported on the suspension, the flexure comprising a substrate layer, a dielectric layer formed thereon, and a conducting layer formed on the dielectric layer, the conducting layer comprising a plurality of conductive traces and a plurality of bonding pads arranged in a first direction and adapted for connecting with a printed circuit board, each bonding pad comprising a first portion and a second portion, a first window being opened on the substrate layer, and a second window corresponding to the first window being opened on the dielectric layer to expose the bonding pads, wherein the substrate layer comprises a plurality of first protuberances extending from at least one side wall of the first window along a second direction which is perpendicular to the first direction to cover the first portion of each bonding pad, and the second portion of each bonding pad comprises at least one notch or hole.

\* \* \* \* \*